United States Patent
Huang et al.

(10) Patent No.: US 9,934,987 B2
(45) Date of Patent: Apr. 3, 2018

(54) CHEMICAL CIRCULATION SYSTEM AND METHODS OF CLEANING CHEMICALS

(71) Applicant: Taiwan Semiconductor Manufacturing Co. Ltd., Hsin-Chu (TW)

(72) Inventors: Chien-Hua Huang, Toufen Township (TW); Chung-Ju Lee, Xin-Zhuang Settlement (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 19 days.

(21) Appl. No.: 15/149,502

(22) Filed: May 9, 2016

(65) Prior Publication Data
US 2016/0254166 A1   Sep. 1, 2016

Related U.S. Application Data

(63) Continuation of application No. 14/050,014, filed on Oct. 9, 2013, now Pat. No. 9,337,055.

(51) Int. Cl.
*H01L 21/302* (2006.01)
*H01L 21/461* (2006.01)
*H01L 21/3213* (2006.01)
*H01L 21/02* (2006.01)
*H01L 21/66* (2006.01)
*H01L 21/67* (2006.01)
*H01L 21/311* (2006.01)

(52) U.S. Cl.
CPC .. *H01L 21/32134* (2013.01); *H01L 21/02068* (2013.01); *H01L 21/67023* (2013.01); *H01L 21/67253* (2013.01); *H01L 22/20* (2013.01); *H01L 21/31144* (2013.01); *H01L 21/6708* (2013.01)

(58) Field of Classification Search
USPC ........................................... 438/754
See application file for complete search history.

(56) References Cited

U.S. PATENT DOCUMENTS 4,576,677 A    3/1986  Faul et al.
2006/0076297 A1*  4/2006  Akahori ............. B01D 61/44
                                                 210/663

\* cited by examiner

*Primary Examiner* — Roberts Culbert
(74) *Attorney, Agent, or Firm* — Slater Matsil, LLP

(57) ABSTRACT

A method includes passing a chemical solution through a metal-ion absorber, wherein metal ions in the metal-ion absorber are trapped by the metal-ion absorber. The chemical solution exiting out of the metal-ion absorber is then used to etch a metal-containing region, wherein the metal-containing region includes a metal that is of a same element type as the metal ions.

20 Claims, 3 Drawing Sheets

CHEMICAL CIRCULATION SYSTEM AND METHODS OF CLEANING CHEMICALS

PRIORITY CLAIM AND CROSS-REFERENCE

This application is a continuation of U.S. patent application Ser. No. 14/050,014, entitled "Chemical Circulation System and Methods of Cleaning Chemicals," filed on Oct. 9, 2013, which application is incorporated herein by reference.

BACKGROUND

Wet etching is a commonly used method in the manufacturing of integrated circuits. For example, in damascene processes, titanium nitride is commonly used to form hard masks, which are used to define the patterns of trenches and via openings, in which copper is filled to form metal lines and vias. Hence, hard masks need to be patterned first, so that their patterns may be transferred to the underlying dielectric layers. Traditionally, after the formation of the metal lines and vias, the hard masks are removed by a Chemical Mechanical Polish (CMP) process.

The removal of titanium nitride may be performed using a wet etch (wet clean) process, during which a chemical solution is used to etch the titanium nitride (TiN). Conventionally, there were two types of wet-clean circulation system. The first is known as the drain-mode system. In the drain-mode system, the wet-clean chemical is pumped into a tank for storage. From the storage, the wet-clean chemical is passed through a particle-filter for filtering large particles. The wet-clean chemical is then heated, and then sent to a process chamber, in which wafers are sprayed with the wet-clean chemical in order to remove the hard mask. The drain-mode wet-clean circulation system results in more waste since the wet-clean chemical is not reused. The manufacturing cost is also high due to the cost of the wet-clean chemical.

The second type of wet-clean circulation system is known as the circulation-mode system. In the circulation-mode system, the wet-clean chemical is pumped into a tank for storage. From the storage, the wet-clean chemical is passed through a particle-filter for filtering large particles. The wet-clean chemical is then heated, and then conducted to a process chamber, in which wafers are sprayed with the wet-clean chemical in order to remove the hard mask. The sprayed wet-clean chemical, which has been used, is then collected, and pumped back to the storage, so that it can be filtered, heated, and sent back to the process chamber again. By using the circulation-mode wet-clean circulation system, the waste of the wet-clean chemical is reduced. However, the dissolved titanium ions remain in the wet-clean chemical, and remain in the circulation system and the pipelines. With the increase in the amount of titanium ions in the wet-clean chemical, the clean efficiency and the TiN removal rate in the wet clean process are reduced. Furthermore, due to the variation in the amount of titanium ions in the wet-clean chemical, the efficiency in the removal of the titanium nitride has variations accordingly, causing variations in the resulting hard mask clean and removal process.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A method for absorbing metal ions in wet-etch chemicals and the apparatus for performing the same are provided in accordance with various exemplary embodiments. The intermediate stages of absorbing the metal ions are illustrated. The variations of the embodiments are discussed. Throughout the various views and illustrative embodiments, like reference numbers are used to designate like elements.

Figure 1:
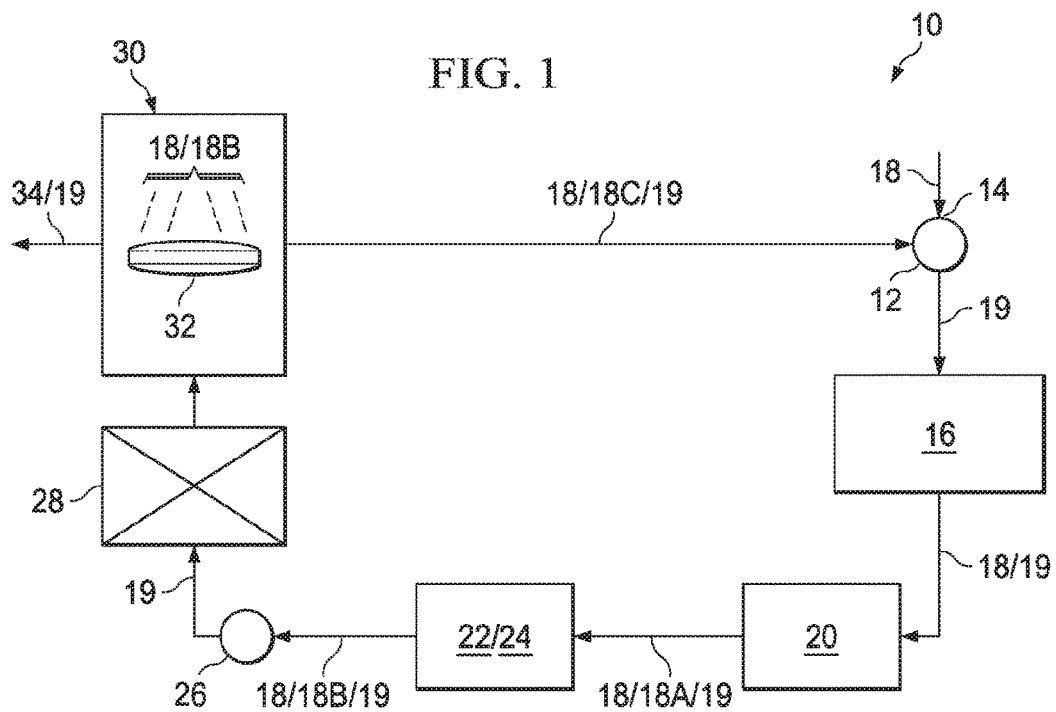
FIG. 1 illustrates a circulation-mode wet-clean circulation system in accordance with some embodiments.

FIG. 1 illustrates circulation-mode wet-clean circulation system 10, which is configured to absorb metal ions in wet-clean chemical 18, which is a chemical solution. Wet-clean circulation system 10 includes pump 12, which functions to pump wet-clean chemical 18 to storage 16. In some embodiment, wet-clean chemical includes polyethylene-polypropylene glycol, glycolether compound, modified oxirane polymer (such as methyl-), organosulfur compound, methylimidazole, aminoethanol, aminopropanol, hydroxyamine, tetramethylammonium hydroxide, hydrophobic or hydrophilic surfactant, hydrogen peroxide, or combinations thereof. Pipes are used to connect the components shown in FIG. 1, wherein reference numeral 19 represents the pipes for conducting wet-clean chemical 18.

Pump 12 may receive from inlet 14 unused wet-clean chemical 18. Throughout the description, the wet-clean chemical 18 may be referred to with a letter such as "A," "B," and "C" suffixed to the reference numeral 18, so that wet-clean chemical 18 in different stages of wet-clean circulation system 10 may be distinguished from each other. Wet-clean chemical 18 is stored in storage 16 before it is used.

Filter 20 is connected to storage 16 to receive wet-clean chemical 18. Filter 20 is configured to filter the particles in wet-clean chemical 18. In some embodiments, filter 20 is configured to filter the particles that are larger than about 15 nm, while the particles that are smaller than about 15 nm are not filtered. Hence, after passing filter 20, wet-clean chemical 18 may still include the particles that have sizes smaller than about 15 nm. Furthermore, metal ions have size smaller than about 15 nm, and hence are not filtered by filter 20.

Figure 2:
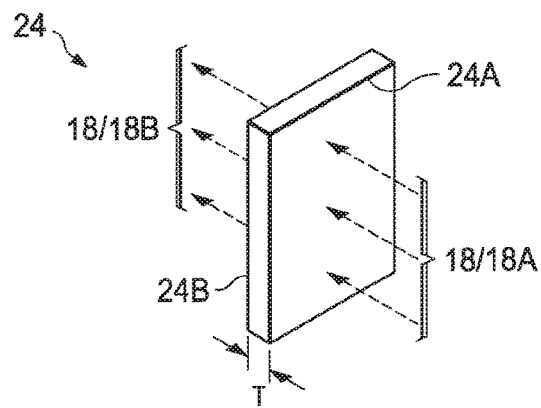
FIG. 2 illustrates a porous exchanger in accordance with some embodiments, wherein the porous exchanger is disposed in a metal-ion absorber in the circulation-mode wet-clean circulation system.

Metal-ion absorber 22 is connected to filter 20 in order to receive the wet-clean chemical 18 that have been filtered by filter 20. FIG. 2 schematically illustrates porous exchanger 24, which is a part of metal-ion absorber 22. The casing outside of the illustrated porous exchanger 24 is not illustrated. Porous exchanger 24 has the function of trapping the metal ions in wet-clean chemical 18 when wet-clean chemical 18 penetrates through the pores of porous exchanger 24. In some embodiments, porous exchanger 24 is a film, as illustrated in FIG. 2.

In some embodiments, porous exchanger 24 includes surface 24A facing the incoming wet-clean chemical 18A, which penetrates through the pores in porous exchanger 24, and exits out of porous exchanger 24 from surface 24B. The exiting wet-clean chemical 18 is denoted as 18B to indicate that the metal ions in wet-clean chemical 18A have been trapped by porous exchanger 24. In accordance with some embodiments, thickness T of porous exchanger 24 is in the range between about 0.0001 mm and about 10 mm. It is appreciated, however, that the values recited throughout the descriptions are merely examples, and may be changed to different values.

In accordance with some embodiments, porous exchanger 24 includes a base material that is porous and includes many micro-pores, which are interconnected to extend from surface 24A to surface 24B. In accordance with some embodiment, the base material includes porous ceramic. In alternative embodiments, the base material includes a carbon-containing or a silica-containing material that is porous. The base material thus has a structure similar to a sponge. The porosity of the base material may be in the range between about 10 percent and about 60 percent. Accordingly, the surfaces of the base material, which surfaces includes the inner surfaces in the pores, are much larger than the surface of porous exchanger 24 facing wet-clean chemical 18.

The surfaces of porous exchanger 24 are coated with a polymer, which may be a resin. The polymer is coated into the pores, so that the surface of the polymer that may contact wet-clean chemical 18 is significantly increased. The polymer has the function of trapping the metal ions, which may include titanium, copper, cobalt, or the like. Depending on the metal ions that are to be absorbed, the polymer may be selected differently. In the exemplary embodiments in which titanium ions present in wet-chemical 18A, the polymer includes functional groups such as cation (R—H), anion (R—OH), amphoteric (R—H+R—OH), or the like. The exemplary polymer includes cross-linked polystyrene, modified zeolite, colestipol, cholestyramine, epoxy, or the like. Porous exchanger 24 may also include activated carbon coated on the base material.

Porous exchanger 24 traps the metal ions, and hence removes the metal ions from wet-clean chemical 18A when it passes through porous exchanger 24. Equations 1, 2, and 3 illustrate some exemplary chemical reactions for trapping the metal ions:

$$R\text{—}H+M^{2+} \rightarrow R\text{-}M+2H^+ \quad [\text{Eq. 1}]$$

$$R\text{—}H+M^{3+} \rightarrow R\text{-}M+3H^+ \quad [\text{Eq. 2}]$$

$$R\text{—}H+M^{4+} \rightarrow R\text{-}M+4H^+ \quad [\text{Eq. 3}]$$

Wherein $M^{2+}$ represents divalent metal ions such as copper ions and titanium ions, $M^{3+}$ represents trivalent metals such as aluminum ions and titanium ions, and $M^{4+}$ represents tetravalent metal ions. R represents the function groups in the polymer. The metal ions react with the polymer to form the R-M (with M being the metal), and hence the metal ions are trapped.

The resulting wet-clean chemical 18B (FIGS. 1 and 2) has much less metal ions than in wet-clean chemical 18A. In some embodiments, the metal ion concentration in wet-clean chemical 18B is less than about 0.1 percent the metal ion concentration in wet-clean chemical 18A. Furthermore, the metal ion concentration in wet-clean chemical 18B may be lower than about 1000 ppm in accordance with some embodiments.

Referring back to FIG. 1, the metal ion concentration in wet-clean chemical 18B is monitored by monitor 26, which performs in-line monitoring when wet-clean chemical 18B passes through. The monitoring method may include Fourier Transform Infrared (FTIR) spectroscopy, Ultra-Violet (UV) visible spectroscopy, Near Infrared (NIR) spectroscopy, or the like. It is appreciated that with the increase in the trapped metal ions in porous exchanger 24, porous exchanger 24's ability for trapping metal ions reduces. Therefore, it needs to be determined when porous exchanger 24 needs to be replaced or rejuvenized, or when the wet-clean chemical 18 needs to be replaced.

Next, as also shown in FIG. 1, wet-clean chemical 18B is heated by heater 28, for example, to a temperature between about 30° C. and about 65° C. The heated wet-clean chemical 18B is then supplied to process chamber 30, in which a process is performed on wafer 32. In some embodiments, the process includes removing a metal containing region that contains the same type of metal that is trapped by metal-ion absorber 22. In some exemplary embodiments, wafer 32 includes a hard mask that includes titanium nitride.

An exemplary process that involves the using of circulation-mode wet-clean circulation system 10 is briefly described below. It is appreciated, however, that circulation-mode wet-clean circulation system 10 may also be used in other processes other than described. The exemplary process includes forming a metal hard mask (not shown) over wafer 32, patterning the metal hard mask, using the patterned metal hard mask to etch an underlying dielectric layer to form trenches or via openings, and removing the hard mask using wet-clean circulation system 10. In subsequent processes, a seed layer (not shown) is deposited on wafer 32, followed by a plating process to fill the trenches and vias openings with a metallic material such as copper. A Chemical Mechanical Polish (CMP) is then performed. The resulting metallic material in the trenches and the via openings form metal lines and vias, respectively.

The metal ions in metal hard mask is dissolved in wet-clean chemical 18B, and the resulting wet-clean chemical 18 including the metal ions is referred to as wet-clean chemical 18C. Wet-clean chemical 18C is collected from process chamber 30. If it is determined that the quality of wet-clean chemical 18C is high enough, and wet-clean chemical 18C is re-usable, it is sent to pump 12, and then pumped back to storage 16. If it is determined that wet-clean chemical 18C cannot be reused anymore, wet-clean chemical 18C is drained (represented by arrow 34) as a waste chemical. As shown in FIG. 1, storage 16, filter 20, monitor 26, heater 28, and process chamber 30 are connected as a loop.

Since wet-clean chemical 18C is eventually drained, fresh wet-clean chemical 18, which may be free from the metal ions, is replenished into wet-clean circulation system 10 from time to time in order to maintain an adequate amount of wet-clean chemical 18.

Figure 3:
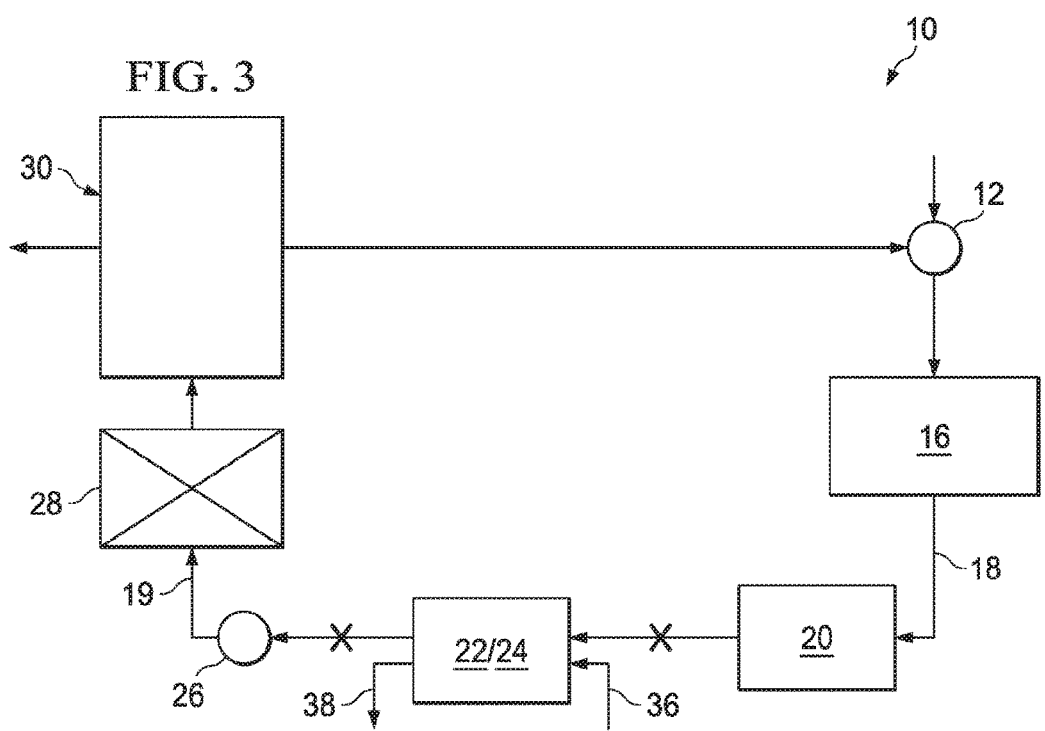
FIG. 3 illustrates an exemplary process for rejuvenizing the porous exchanger in accordance with some embodiments.

When it is determined that porous exchanger 24 (FIG. 2) has trapped enough metal ions to a degree that its metal-trapping ability needs to be improved, porous exchanger 24 is rejuvenized. The determination may be achieved by monitoring the metal ions in wet-clean chemical 18B that comes out of porous exchanger 24. Alternatively, porous exchanger 24 may be rejuvenized periodically. For example, if the metal ion concentration in wet-clean chemical 18B is higher than a threshold level, then porous exchanger 24 needs to be rejuvenized. FIG. 3 illustrates an exemplary process for rejuvenizing porous exchanger 24. First, the introduction of wet-clean chemical 18A into metal-ion absorber 22 is stopped. Rejuvenizing chemical 36 is then introduced into porous exchanger 24 to remove metal ions from porous exchanger 24. During the rejuvenizing process, rejuvenizing chemical 36 may pass through the pores in porous exchanger 24, so that rejuvenizing chemical 36 is in contact with the polymer and the trapped metal ions.

The available rejuvenizing chemicals 36 include solvents and gases. For example, the exemplary rejuvenizing chemicals 36 include a base or an acid, and porous exchanger 24 is flushed using the exemplary rejuvenizing chemicals 36. Alternatively, the rejuvenizing process may include a thermal desorption, wherein a hot solvent is used to remove the metal ions. In some embodiments, the hot solvent includes sulfuric acid, phosphate acid, sodium hydroxide, or the like. In yet alternative embodiments, hydrogen ($H_2$) may be used to remove the metal ions from the polymer in porous exchanger 24. In some embodiments, after the rejuvenizing process, the polymer is restored back to the form R—H, R—OH, or the like, wherein the metal ions ($M^{2+}$, $M^{3+}$, and/or $M^{4+}$, refer to Equations 1 through 3) that are connected to the functional groups R in the polymers are replaced by hydrogen (H) or hydroxide (OH). The metal ions are removed from metal-ion absorber 22 along with the used rejuvenizing chemicals 36, which is denoted as 38 in FIG. 3.

The rejuvenizing process may be performed inside metal-ion absorber 22. Alternatively, porous exchanger 24 is taken outside of metal-ion absorber 22 to perform the rejuvenizing process. After the rejuvenizing process, the flow of wet-clean chemical 18 is restored, and wet-clean circulation system 10 re-operates.

Figure 4:
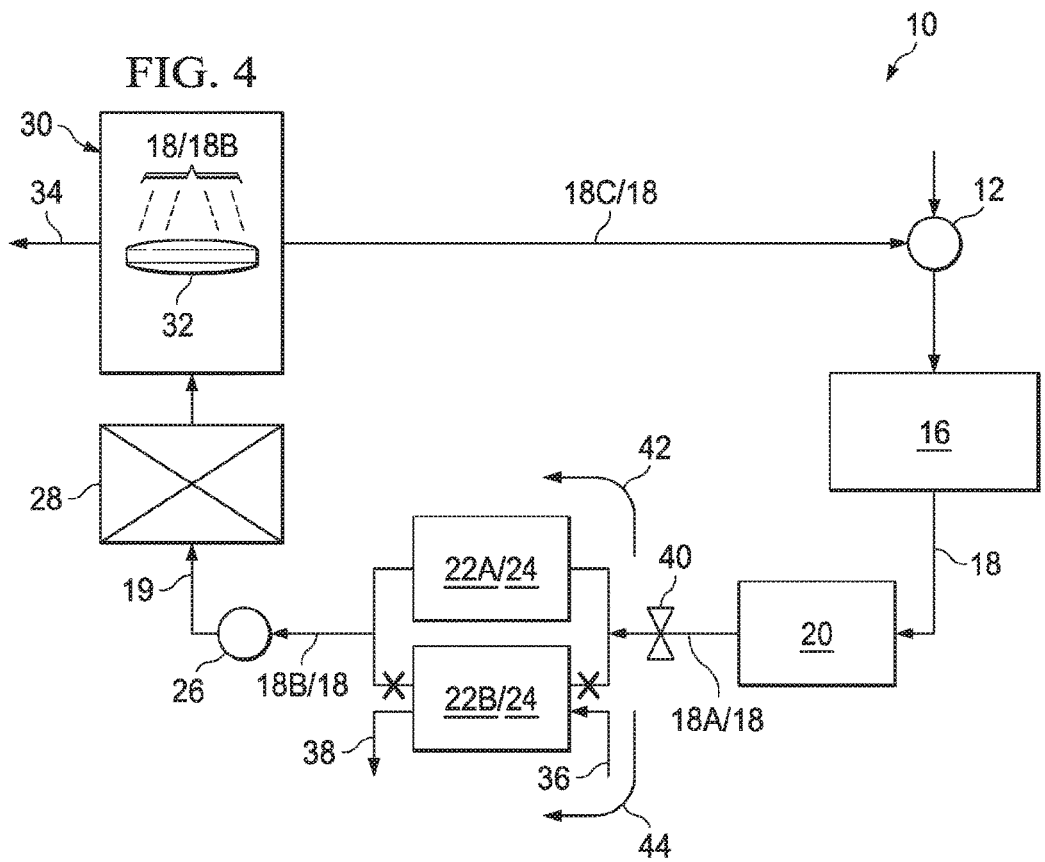
FIG. 4 illustrates an exemplary process for rejuvenizing the porous exchanger in a first channel of a dual-channel metal-ion absorber in accordance with some embodiments.
Figure 5:
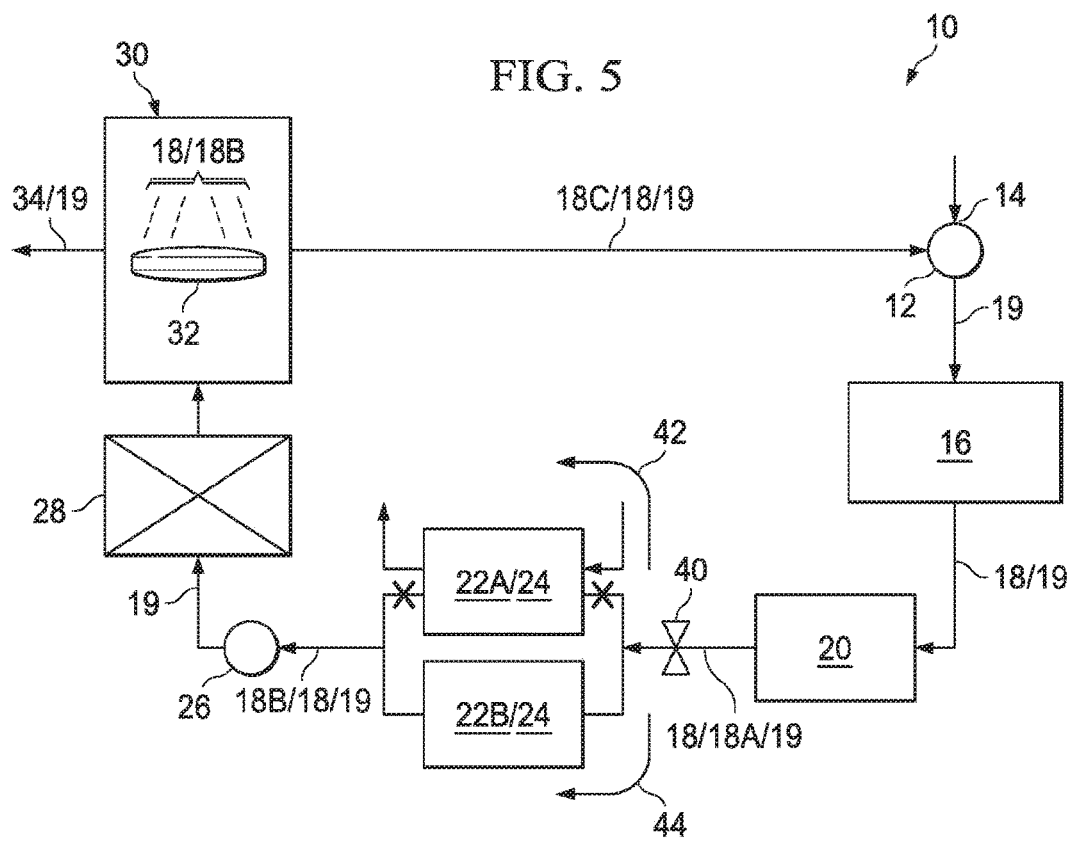
FIG. 5 illustrates an exemplary process for rejuvenizing the porous exchanger in a second channel of the dual-channel metal-ion absorber in accordance with some embodiments.

FIGS. 1 and 3 illustrate single-channel wet-clean circulation system 10 in accordance with some embodiments. In alternative embodiments, wet-clean circulation system 10 include multiple channels, which may be include two channels, three channels, four channels, or more than four channels. The multi-channel wet-clean circulation system 10 may work under a switch mode, wherein the multiple channels may be switched on and off, so that one of the channels is always turned on to trap the metal ions. FIGS. 4 and 5 illustrate the operation of an exemplary switch-mode dual-channel wet-clean circulation system 10. Referring to FIG. 4, two channels are connected to filter 20 through switch 40. The first channel includes metal-ion absorber 22A and the corresponding pipes. The second channel includes metal-ion absorber 22B and the corresponding pipes. Each of metal-ion absorbers 22A and 22B may have a structure essentially the same as metal-ion absorber 22 in FIG. 1. Switch 40 is configured to turn on one of the first channel 42 and second channel 44, so that the corresponding metal-ion absorber 22A or 22B receives wet-clean chemical 18. At the same time, the other channel is turned off by switch 40, as shown by the "x" marks. For example, in FIG. 4, the first channel 42 is turned on, and hence metal-ion absorber 22A is used to trap the metal ions in wet-clean chemical 18A. The porous exchanger 24 in the second channel may be rejuvenized at this time by conducting rejuvenizing chemicals 36 into metal-ion absorber 22B. The used rejuvenizing chemical 38 is also drained.

Referring to FIG. 5, the second channel 44 is turned on, and hence metal-ion absorber 22B is used to trap the metal ions in wet-clean chemical 18A. The first channel 42 is turned off, as shown by the "x" marks. The porous exchanger 24 in the first channel 42 is rejuvenized. Accordingly, by switching the multi-channels, there is always one channel that is on-line for processing wet-clean chemical 18A. The down time of the respective wet-clean circulation system 10 is minimized.

In the embodiments of the present disclosure, the metal ions in the wet-clean chemical are removed, and hence the lifetime of the wet-clean chemical is extended. The loading of the wet-clean chemical is improved, and the wet clean process in accordance with the embodiments is more stable. Furthermore, the manufacturing cost of the respective integrated manufacturing process is reduced due to the saving in the wet-clean chemical. The chemical waste is also reduced.

In accordance with some embodiments, a method includes passing a chemical solution through a metal-ion absorber, wherein metal ions in the metal-ion absorber are trapped by the metal-ion absorber. The chemical solution exiting out of the metal-ion absorber is then used to etch a metal-containing region, wherein the metal-containing region includes a metal that is of a same element type as the metal ions.

In accordance with other embodiments, a chemical solution is passed through a metal-ion absorber. The titanium ions in the chemical solution are trapped by the metal-ion absorber when the chemical solution is passed through the metal-ion absorber. A hard mask in a semiconductor wafer is etched using the chemical solution that flows out of the metal-ion absorber, wherein the hard mask comprises titanium. The chemical solution is collected after the chemical solution is used to etch the hard mask. The chemical solution that is used to etch the hard mask is conducted back to the metal-ion absorber.

In accordance with yet other embodiments, an apparatus includes a metal-ion absorber configured to absorb metal ions in a chemical solution, and a process chamber connected to the metal-ion absorber through a pipe. The pipe is configured to conduct the chemical solution from the metal-ion absorber to the process chamber. The process chamber is configured to perform an etching on a hard mask in a wafer. A conduction path connects the process chamber back to the metal-ion absorber, wherein the conduction path is configured to conduct the chemical solution back to the metal-ion absorber.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   using a wet-clean circulation system to circulate a chemical solution, the wet-clean circulation system comprising:
   a storage;
   a filter connected to the storage;
   a metal ion absorber connected to the filter;
   a monitor connected to the metal ion absorber; and
   a process chamber, wherein the storage, the filter, the metal ion absorber, the monitor, and the process chamber are connected in series to allow the chemical solution to circulate in the wet-clean circulation system;
   conducting the chemical solution through a first metal-ion exchanger in the metal ion absorber to remove metal ions from the chemical solution; and
   rejuvenizing the first metal-ion exchanger.

2. The method of claim 1 further comprising reusing the first metal-ion exchanger that has been rejuvenized to further perform metal ion exchange in the wet-clean circulation system.

3. The method of claim 1 further comprising:
   conducting the chemical solution through the filter; and
   monitoring an amount of metal ions in the chemical solution.

4. The method of claim 3, wherein the rejuvenizing the first metal-ion exchanger is performed in response to a result of the monitoring the amount of metal ions.

5. The method of claim 1, wherein the first metal-ion exchanger comprises:
   a base material with a plurality of pores in the base material, wherein the plurality of pores is interconnected with each other to form a plurality of paths penetrating through the base material; and
   a polymer coated on inner surfaces of the plurality of pores, wherein the polymer is configured to trap metal ions in the chemical solution.

6. The method of claim 1, wherein the metal ion absorber comprises:
   a first channel comprising the first metal-ion exchanger; and
   a second channel comprising a second metal-ion exchanger, wherein each of the first channel and the second channel is configured to be turned on and off individually.

7. The method of claim 6 further comprising:
   switching off the first channel to stop the first metal-ion exchanger from receiving the chemical solution, wherein the rejuvenizing the first metal-ion exchanger is performed after the first channel is switched off; and
   switching on the second channel to allow the second metal-ion exchanger to trap metal ions in the chemical solution.

8. A method comprising:
   circulating a chemical solution in a wet-clean circulation system, wherein the wet-clean circulation system comprises:
   a storage configured to store the chemical solution;
   a filter configured to filter particles in the chemical solution;
   a metal ion absorber configured to absorb metal ions in chemical solution; and
   a monitor configured to monitor the chemical solution;
   etching a metal-containing feature in a wafer using the chemical solution;
   removing metal ions from the chemical solution that has been used to generate a cleaned chemical solution; and
   using the cleaned chemical solution to etch a second wafer.

9. The method of claim 8 further comprising replenishing unused chemical solution to mix with the chemical solution that has been used for etching the metal-containing feature.

10. The method of claim 9, wherein the removing the metal ions is performed on the chemical solution that comprises the unused chemical solution mixed with the chemical solution that has been used for etching the metal-containing feature.

11. The method of claim 8, wherein the wet-clean circulation system is configured to monitor an amount of metal ions in the chemical solution using the monitor, and rejuvenize a metal-ion exchanger in the metal ion absorber.

12. The method of claim 8, wherein the metal ion absorber comprises a metal-ion exchanger, and the metal-ion exchanger comprises:
   a porous base material; and
   a polymer coated on surfaces of the porous base material, wherein the polymer is coated into pores of the porous base material.

13. The method of claim 8, wherein the metal ion absorber comprises:
   a first channel comprising a first metal-ion exchanger; and
   a second channel parallel to the first channel, the second channel comprising a second metal-ion exchanger, wherein both the first channel and the second channel are configured to conduct the chemical solution.

14. The method of claim 13 further comprising:
   switching off the first channel to stop the first metal-ion exchanger from receiving the chemical solution; and
   switching on the second channel to allow the second metal-ion exchanger to trap metal ions in the chemical solution.

15. The method of claim 11 further comprising using the rejuvenized metal-ion exchanger to further remove metal ions from chemical solutions.

16. The method of claim 8, wherein the etching is performed in a process chamber comprising a drain and a conducting path connecting the process chamber to the storage, and the wet-clean circulation system is configured to:
   determining a quality of the chemical solution collected from the process chamber;
   in response to the quality to be higher than a predetermined quality, conducting the chemical solution back to the storage; and
   in response to the quality to be lower than the predetermined quality, drain the chemical solution to the drain.

17. A method comprising:
   etching a first wafer using a chemical solution in a process chamber;
   directing the chemical solution out of the process chamber;
   mixing the chemical solution directed out of the process chamber with a fresh chemical solution to generate a mixed chemical solution; and
   removing metal ions in the mixed chemical solution using a wet-clean circulation system, wherein the wet-clean circulation system comprises:
   a metal ion absorber configured to absorb the metal ions in the chemical solution;

a monitor connected to an outlet of the metal ion absorber, wherein the monitor is configured to monitor an amount of metal ions in the chemical solution; and the process chamber, wherein the process chamber is configured to receive the chemical solution out of the monitor.

18. The method of claim 17, wherein the wet-clean circulation system comprises a closed loop, with the metal ion absorber, the monitor, and the process chamber in the closed loop.

19. The method of claim 17 further comprising:

in response to a result of monitoring the amount of metal ions, rejuvenizing a metal ion exchanger in the metal ion absorber; and reusing the metal ion exchanger that has be rejuvenized.

20. The method of claim 17, wherein the metal ion absorber comprises:

a first channel comprising a first metal-ion exchanger; and a second channel comprising a second metal-ion exchanger, wherein each of the first metal-ion exchanger and the second metal-ion exchanger is configured to absorb ions when the other one of the first metal-ion exchanger and the second metal-ion exchanger is being rejuvenized.

* * * * *